United States Patent [19]

Colak

[11] 4,300,150
[45] Nov. 10, 1981

[54] LATERAL DOUBLE-DIFFUSED MOS TRANSISTOR DEVICE

[75] Inventor: Sel Colak, Briarcliff Manor, N.Y.

[73] Assignee: North American Philips Corporation, New York, N.Y.

[21] Appl. No.: 159,883

[22] Filed: Jun. 16, 1980

[51] Int. Cl.³ .............................................. H01L 29/72
[52] U.S. Cl. ...................................... 357/23; 357/52; 357/13
[58] Field of Search .............................. 357/23, 52, 13

[56] References Cited

U.S. PATENT DOCUMENTS 4,190,850  2/1980  Tihanyi et al. ........................ 357/23

*Primary Examiner*—Edward J. Wojciechowicz
*Attorney, Agent, or Firm*—Thomas A. Briody; Robert T. Mayer; Steven R. Biren

[57] ABSTRACT

A lateral double-diffused MOS transistor includes a field-shaping semiconductor layer which serves to improve the breakdown voltage and/or on-resistance characteristics of the device. The field-shaping layer redistributes the electrical field in the device during operation in order to eliminate electrical field crowding in portions of the device where breakdown would otherwise first occur. The field shaping layer may be a buried layer, a surface layer, or a composite layer having both buried and surface layer portions.

8 Claims, 4 Drawing Figures

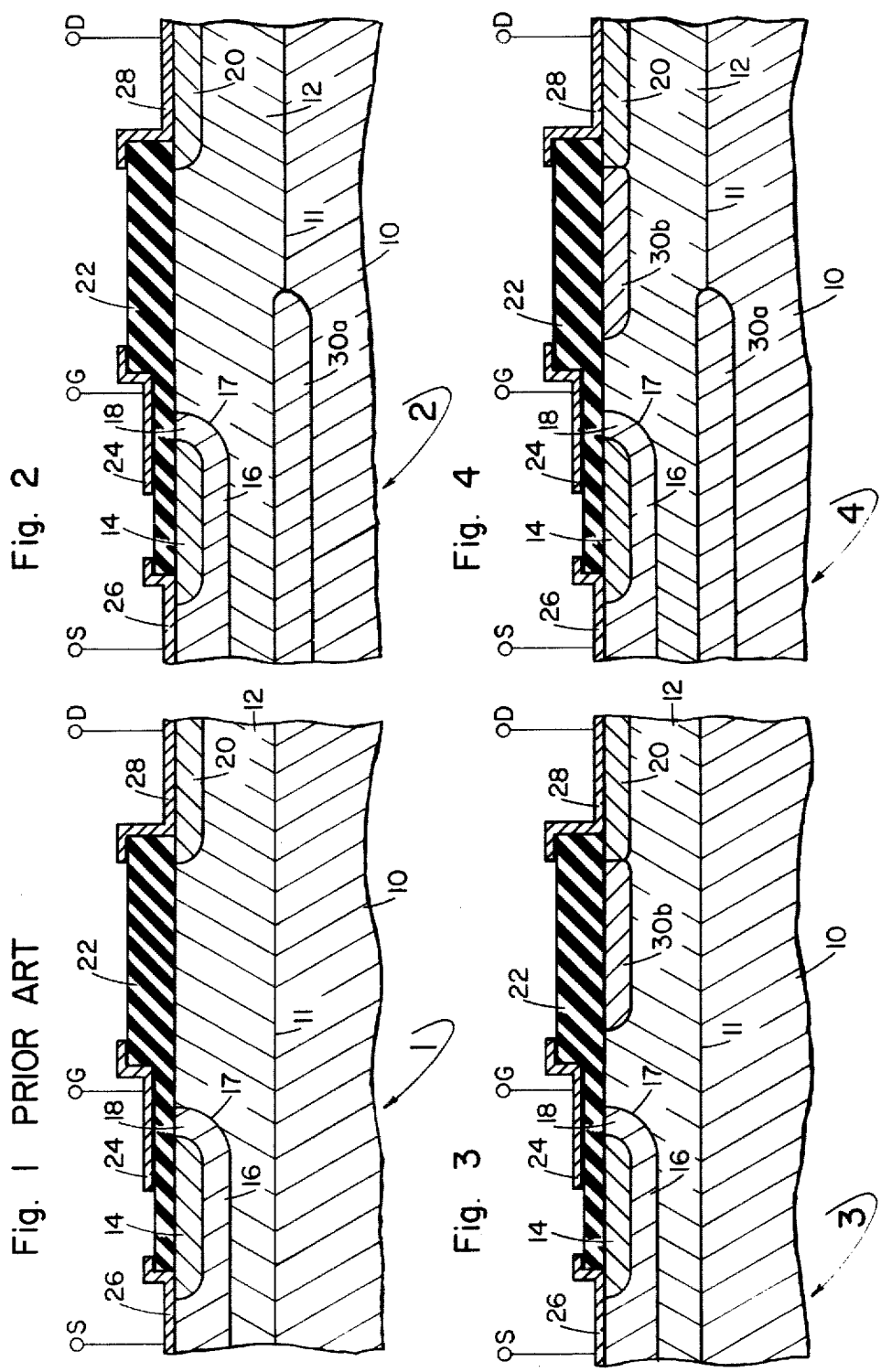

LATERAL DOUBLE-DIFFUSED MOS TRANSISTOR DEVICE

BACKGROUND OF THE INVENTION

The invention is in the field of metal-oxide-semiconductor (MOS) field-effect devices, and relates specifically to lateral double-diffused MOS (DMOS) field-effect transistors.

Such transistors are well-known in the art and a typical high-voltage DMOS transistor is shown on page 1325 of the "IEEE Transactions on Electron Devices", Vol. ED-25, No. 11, November 1978, in a paper entitled "Tradeoff Between Threshold Voltage and Breakdown in High-Voltage Double-Diffused MOS Transistors", by Pocha et al. This device includes a semiconductor substrate of a first conductivity type (p-type), an epitaxial surface layer of a second conductivity type (n-type) on the substrate, a surface-adjoining channel region of the first conductivity type in the epitaxial layer, a surface-adjoining source region of the second conductivity type in the channel region, and a surface-adjoining drain region of the second conductivity type in the epitaxial layer and spaced apart from the channel region. An insulating layer is provided on the epitaxial surface layer and covers at least that portion of the channel region located between the source and drain. A gate electrode is provided on the insulating layer, over a portion of the channel region between the source and drain and is electrically isolated from the epitaxial surface layer, while source and drain electrodes are connected respectively to the source and drain regions of the transistor. Such prior art high-voltage DMOS transistors typically have a relatively thick epitaxial layer, in the order of about 25–30 micrometers for a breakdown voltage of about 250 V, as indicated in the Pocha et al paper.

Generalized techniques for improving the high-voltage breakdown characteristics of p-n junctions are disclosed in U.S. Patent Application Ser. No. 913,026, filed June 6 1978, by V. Temple. Subsequently, it was found that the breakdown characteristics of high-voltage semiconductor devices could be improved using the REduced SURface Field or RESURF) technique, as described in "High Voltage Thin Layer Devices (RESURF Devices)", "International Electronic Devices Meeting Technical Digest", December, 1979, pages 238–240, by Appels et al, and U.S Pat. application Ser. No. 004,004, filed Jan. 16, 1979, by Appels et al, incorporated herein by reference. Essentially, the improved breakdown characteristics of RESURF devices are achieved by employing thinner but more highly doped epitaxial layers to reduce surface fields.

The RESURF technique was applied to lateral double-diffused MOS transistors, as reported in "Lateral DMOS Power Transistor Design", "IEEE Electron Device Letters", Vol. EDL-1, pages 51–53, April, 1978, by Colak et al, and the result was a substantial improvement in device characteristics. It should be understood that in high-voltage DMOS devices, there is always a trade-off between breakdown voltage and on-resistance, with the goal being to increase the breakdown voltage level while maintaining a relatively low on-resistance. Using the prior art RESURF technique, and for reference assuming a constant breakdown voltage, an improvement (e.g. decrease) in on-resistance by a factor of about 3 may be obtained in a device occupying the same area as a conventional (thick epitaxial layer) DMOS device. Nevertheless, a further improvement in the breakdown voltage and/or on-resistance characteristics of such devices is extremely desirable, in particular for high-voltage power devices where both breakdown voltage and on-resistance are important parameters. Alternatively, it would be desirable to provide DMOS devices with the same characteristics as prior art devices but which occupy a smaller area and are thus less expensive to produce.

SUMMARY OF THE INVENTION

It is therefore an object of the present invention to provide a lateral double-diffused MOS transistor which features improved characteristics in the area of breakdown voltage and/or on-resistance.

It is a further object of the invention to alternatively provide lateral double-diffused MOS transistors with breakdown voltage and on-resistance characteristics comparable to those of prior-art devices, but which occupy a smaller area and thus cost less to manufacture.

In accordance with the invention, these objectives are achieved by a lateral double-diffused MOS transistor of the type described above which is characterized in that a field-shaping semiconductor layer of the first conductivity and having a doping level greater than that of the substrate is provided adjacent but spaced apart from the channel region. This semiconductor layer serves to redistribute the electrical field density in the device during operation by reducing the field in a first part of the epitaxial layer mainly located between the source and drain regions and adjacent the p-n junction between the epitaxial layer and the channel region, while increasing the electrical field density in a second part of the epitaxial layer mainly located adjacent the drain regon. This field-shaping semiconductor layer may be advantageously employed in devices in which the epitaxial layer is provied in accordance with the RESURF technique, although conventional DMOS devices will also be improved by the invention. The semiconductor layer which serves to redistribute the electrical field may either be a buried layer provided substantially in the substrate beneath the channel region or a surface layer provided in the epitaxial layer alongside the drain region. In a further embodiment of the invention, the semiconductor layer includes both a buried layer portion and a surface layer portion.

Each of the embodiments mentioned above serves to reduce the electrical field during operation in those parts of the device where reverse avalanche breakdown would normally occur first, thus enabling these devices to achieve a higher breakdown voltage. In particular, transistors in accordance with the present invention are theoretically capable of providing a factor of improvement in on-resistance of about 1.5 to 2.0 for a constant breakdown voltage, as compared to conventional DMOS transistors employing the RESURF technique. Alternatively, devices in accordance with the invention are capable of providing an improvement in breakdown voltage for a constant on-resistance.

BRIEF DESCRIPTION OF THE DRAWING

FIG. 1 is a cross-sectional view of a lateral double-diffused MOS transistor of conventional design;

FIG. 2 is a cross-sectional view of a lateral double-diffused MOS transistor in accordance with a first embodiment of the invention;

FIG. 3 is a cross-sectional view of a lateral double-diffused MOS transistor in accordance with a second embodiment of the invention; and FIG. 4 is a cross-sectional view of a lateral double-diffused MOS transistor in accordance with a third embodiment of the invention.

DETAILED DESCRIPTION

FIG. 1 of the drawing shows a typical prior art double-diffused MOS transistor suitable for high-voltage applications. It should be noted that FIG. 1, as well as the remaining figures of the drawing, are not drawn to scale, and in particular the vertical dimensions are exaggerated for improved clarity. Additionally, like parts are designated with like reference numerals in the various figures, and semiconductor regions of the same conductivity type are shown hatched in the same direction.

In FIG. 1, a DMOS transistor 1 has a semiconductor substrate 10 of a first conductivity type, typically p-type, with an epitaxial surface layer 12 of a second conductivity type opposite to that of the first, typically n-type, on a major surface 11 of the substrate. A surface-adjoining channel region 16 of the first conductivity type is provided in the epitaxial layer and forms a p-n junction 17 therewith. A surface-adjoining source region 14 of the second conductivity type is provided in the channel region 16, while a surface-adjoining drain region 20, also of the second conductivity type, is provided in the epitaxial layer 12 at a location which is spaced apart from the channel region 16. The channel region 16 has a surface-adjacent portion 18 located between the source and drain regions of the device which forms the channel of the device. An insulating layer 22 is provided on the epitaxial surface layer 12 and covers at least that portion of the channel region 16 located between the source and drain regions of the transistor. While insulating layer 22 is shown as a stepped layer and is of silicon oxide, other configurations and insulating materials can be used without departing from the scope of the invention. A gate electrode 24 is provided on the insulating layer 22 over the channel 18, and source (26) and drain (28) electrodes provide electrical connections, respectively, to the source and drain regions of the transistor.

Devices of the general type shown in FIG. 1 are well known in the art, and hence will not be described in further detail. As noted above, the epitaxial surface layer 12 in such prior-art devices is typically a relatively thick layer, having a thickness in the order of about 25 to 30 micrometers for breakdown voltages of about 250 volts. Such relatively thick epitaxial layers tend to make these devices subject to reverse avalance breakdown of the p-n junction 17 in the curved area of the junction beneath the gate electrode 24 due to the field crowding in this area. This characteristic is particularly undesirable in high-voltage applications because it limits the maximum operating voltage of the transistor.

The Reduced Surface Field (RESURF) technique, as applied to lateral double-diffused MOS transistors in the previously-mentioned Colak et al paper, serves to partially overcome this problem. By substantially reducing the epitaxial layer thickness, down to about 3 to 15 micrometers, while at the same time increasing the doping level in the epitaxial layer to maintain an acceptable on-resistance value, a substantial improvement in high-voltage breakdown characteristics can be obtained. Thus, FIG. 1 may also represent a prior art RESURF DMOS transistor, assuming that the appropriate thickness and resistivity values for the epitaxial layer 12 are selected. In accordance with the RESURF technique, the product of doping concentration and epitaxial layer thickness ($N_{epi} \times d_{epi}$) should typically be approximately $10^{12}$ atoms/cm$^2$. Using this technique, on-resistance can be reduced by a factor of about 3 for a device occupying the same area as a conventional device, while maintaining the same breakdown voltage. Alternatively, a like improvement in breakdown voltage can be obtained for the same on-resistance, or, as a third alternative, more moderate improvements in both breakdown voltage and on-resistance can be obtained.

The present invention is based upon the discovery that by redistributing the electrical field density within a lateral double-diffused MOS transistor by using a field-shaping semiconductor layer, in either conventional or RESURF DMOS devices, a substantial improvement in breakdown voltage and/or on-resistance may be obtained. While the invention may be applied to conventional DMOS transistors, optimum performance is obtained by providing the field-shaping semiconductor layer of the invention in devices in which the epitaxial layer is selected in accordance with the RESURF technique, as described above. In both cases the invention is characterized in that the electrical field redistribution is accomplished by a field-shaping semiconductor layer of the first conductivity type which has a doping level greater than that of the substrate and is provided adjacent but spaced apart from the channel region of the device. This field-shaping semiconductor layer serves to reduce the electrical field density during operation of the device in a first part of the epitaxial layer mainly located adjacent the p-n junction 17 and between the source and drain regions of the device, while increasing the electrical field density during operation in a second part of the epitaxial layer mainly located adjacent the drain region 20. In this manner, a more homogeneous electrical field distribution is obtained, and the electrical field crowding in the curved area of the junction where reverse avalanche breakdown previously occurred is reduced.

Using a field-shaping semiconductor layer in accordance with the present invention, devices can be fabricated having a further improvement in breakdown voltage and/or on-resistance (i.e. an overall improvement factor) of about 1.5-2.0 times, as compared to RESURF DMOS devices having a like area. This improvement is obtained by using a selected field-shaping layer configuration and appropriate values for the epitaxial layer thickness and doping level, as described below.

FIG. 2 of the drawing shows a DMOS transistor 2 in which the field-shaping semiconductor layer of the first conductivity type is a buried layer 30a which is provided substantially in the substrate 10 at its major surface 11. Buried layer 30a extends beneath the channel region 16 and the part of the epitaxial layer between the source and drain regions 14 and 20 which is adjacent to the p-n junction 17. As shown in FIG. 2, the buried layer 30a will typically extend across the entire area below the gate electrode 24 and stop shortly thereafter. The field-shaping buried semiconductor layer 30a is of the same conductivity type as that of the substrate 10, so that a typical device with a p-type substrate would have a p-type buried layer 30a. However, the doping level of the buried layer 30a is greater than that of the substrate. For example, devices have been fabricated in which the buried layer is formed in the substrate by ion implantation, although the invention is not limited to this technique, with a thickness in the range of about 3.0 to 5.0 micrometers and a doping level of about 1.0 to $1.5 \times 10^{12}$ atoms/cm$^2$. Due to the nature of the ion implantation process, a small portion of the buried layer 30a extends into the epitaxial layer 12.

In the device described above, the doping level of the epitaxial layer 12 is about $3.0 \times 10^{15}$ atoms/cm$^3$ and its thickness is about 6 micrometers, while the doping level of the substrate is about $4.0 \times 10^{14}$ atoms/cm$^2$. The substrate 10, the buried layer 30a and the channel region 16 are all of p-type material, while the epitaxial layer 12, the source region 14 and the drain region 20 are of n-type material.

In the first devices manufactured in accordance with the embodiment described above and shown in FIG. 2, breakdown voltages in the order of about 370 volts were measured with on-resistance values of about 5.0 ohms-mm$^2$. These initial results represent an overall improvement factor of about 1.5 over prior-art DMOS devices made at the same facility and employing the RESURF principle, and an overall improvement factor of about 4.5 over conventional lateral double-diffused MOS transistors with thick epitaxial layers.

In the embodiment shown in FIG. 3, the field-shaping semiconductor layer of a DMOS transistor 3 is a surface layer 30b which is provided in a surface-adjoining region of the epitaxial layer 12 alongside the drain region 20 and extending from the drain region toward the channel region 16 of the device transistor 3, although the surface layer 30b does not extend so far as to contact the channel region. In this case, the doping concentration of the surface layer is approximately $1.0 \times 10^{12}$ atoms/cm$^2$, while the thickness of the surface layer is about 1.0 to 1.5 micrometers. The surface layer may be provided in the epitaxial layer by ion implantation, and the epitaxial layer thickness and doping level, as well as the doping level of the substrate, are approximately the same as for the device shown in FIG. 2.

In the embodiment shown in FIG. 4, both a buried layer 30a and a surface layer 30b are provided in a single DMOS transistor 4. Using this configuration, the doping level in each of the field-shaping layer portions 30a and 30b is aobut one-half of the value previously mentioned for the corresponding layer in the single-layer embodiments of FIGS. 2 and 3. In other respects, the embodiment of FIG. 4 is generally similar to the previously-described devices, and thus will not be described in further detail.

Thus, by providing a field-shaping semiconductor layer in a DMOS transistor adjacent to its channel region, th present invention serves to redistribute the electrical field density in the epitaxial layer of the device during operation, thereby providing improved high-voltage breakdown and/or on-resistance characteristics. Alternatively, the invention may be used to obtain DMOS devices with characteristics comparable to those of prior art devices, but which occupy a smaller area and are thus less expensive to manufacture.

Finally, while the invention has been particularly shown and described with reference to certain preferred embodiments thereof, it will be understood by those skilled in the art that various changes in form and detail may be made without departing from the spirit and scope of the invention.

I claim:

1. A lateral double-diffused MOS transistor having a semiconductor substrate of a first conductivity type, an epitaxial surface layer of a second conductivity type opposite to that of the first on a major surface of said substrate, a surface-adjoining channel region of said first conductivity type in said epitaxial layer and forming a p-n junction therewith, a surface-adjoining source region of said second conductivity type in said channel region, a surface-adjoining drain region of said second conductivity type in said epitaxial layer and spaced apart from said channel region, an insulating layer on said surface layer and covering at least that portion of said channel region located between said source region and said drain region, a gate electrode on said insulating layer, over said portion of the channel region and electrically isolated from said surface layer, and source and drain electrodes connected respectively to the source and drain regions of said transistor, characterized in that an electrical field redistribution means comprising a field-shaping semiconductor layer of said first conductivity type and having a doping level greater than that of said substrate is provided adjacent but spaced apart from said channel region for reducing the electrical field density during operation in a first part of the epitaxial layer mainly located adjacent said p-n junction and between said source and drain regions while increasing the electrical field density during operation in a second part of the epitaxial layer mainly located adjacent said drain region.

2. A lateral double-diffused transistor as in claim 1, wherein the doping concentration and thickness of said epitaxial surface layer are selected in accordance with the REduced SURface Field ((RESURF) technique.

3. A lateral double-diffused transistor as in claim 1 or 2, wherein said field-shaping semiconductor layer is a buried layer provided substantially in said substrate at said major surface thereof and extends at least beneath said channel region and said first part of the epitaxial layer.

4. A lateral double-diffused transistor as in claim 3, wherein said buried layer has a thickness of about 3.0 to 5.0 micrometers and a doping level of about 1.0 to $1.5 \times 10^{12}$ atoms/cm$^2$, and said epitaxial layer has a thickness of about 6.0 micrometers and a doping level of about $3.0 \times 10^{15}$ atoms/cm$^3$.

5. A lateral double-diffused transistor as in claim 1 or 2, wherein said field-shaping semiconductor layer is a surface layer provided in a surface-adjoining region of said epitaxial layer alongside said drain region and extending from said drain region toward, but not contacting, said channel region.

6. A lateral double-diffused transistor as in claim 5, wherein said surface layer has a thickness of about 1.0 to 1.5 micrometers and a doping level of about $1.0 \times 10^{12}$ atoms/cm$^2$, and said epitaxial layer has a thickness of about 6.0 micrometers and a doping level of about $3.0 \times 10^{15}$ atoms/cm$^3$.

7. A lateral double-diffused transistor as in claim 1 or 2, wherein said field-shaping semiconductor layer comprises a buried layer portion provided substantially in said substrate at said major surface and extending at least beneath said channel region and said first part of the epitaxial layer, and a surface layer portion provided in a surface-adjoining region of said epitaxial layer alongside said drain region and extending from said drain region toward, but not contacting, said channel region.

8. A lateral double-diffused transistor as in claim 7, wherein said buried layer portion has a thickness of about 3.0 to 5.0 micrometers and a doping level of about 0.5 to $0.75 \times 10^{12}$ atoms/cm$^2$, said surface layer portion has a thickness of about 1.0 to 1.5 micrometers and a doping level of about $0.5 \times 10^{12}$ atoms/cm$^2$, and said epitaxial layer has a thickness of about 6.0 micrometers and a doping level of about $3.0 \times 10^{15}$ atoms/cm$^3$.

* * * * *